United States Patent [19]
Norman

[11] Patent Number: 6,073,208
[45] Date of Patent: *Jun. 6, 2000

[54] APPARATUS AND METHOD FOR REDUCING PROGRAMMING CYCLES FOR MULTISTATE MEMORY SYSTEM

[75] Inventor: Robert D. Norman, San Jose, Calif.

[73] Assignee: Micron Technology, Inc., Boise, Id.

[*] Notice: This patent is subject to a terminal disclaimer.

[21] Appl. No.: 09/190,975

[22] Filed: Nov. 12, 1998

Related U.S. Application Data

[63] Continuation of application No. 08/730,099, Oct. 15, 1996, Pat. No. 5,907,855.

[51] Int. Cl.$^7$ .............................. G06F 12/00; G06F 13/00
[52] U.S. Cl. .............................. 711/103; 711/5; 711/118; 711/154; 365/900; 365/120
[58] Field of Search ................ 711/5, 103, 154, 711/118; 365/900, 120; 712/37

[56] References Cited

U.S. PATENT DOCUMENTS

| | | | |
|---|---|---|---|
| 4,970,691 | 11/1990 | Atsumi et al. | 365/189.11 |
| 5,394,362 | 2/1995 | Banks | 365/189.01 |
| 5,440,505 | 8/1995 | Fazio et al. | 365/45 |
| 5,450,363 | 9/1995 | Christopherson et al. | 365/205 |
| 5,497,119 | 3/1996 | Tedrow et al. | 327/540 |
| 5,539,690 | 7/1996 | Talreja et al. | 365/185.22 |
| 5,566,111 | 10/1996 | Choi | 365/185.22 |
| 5,566,125 | 10/1996 | Fazio et al. | 365/45 |
| 5,568,426 | 10/1996 | Roohparvar et al. | 365/185.22 |
| 5,636,166 | 6/1997 | Roohparvar | 365/194 |
| 5,671,388 | 9/1997 | Hasbun | 395/430 |

*Primary Examiner*—Tuan V. Thai
*Attorney, Agent, or Firm*—Schwegman, Lundberg, Woessner & Kluth, P.A.

[57] ABSTRACT

An apparatus and method for reducing the number of programming states (threshold voltage levels) required to be traversed when programming a multistate memory cell with a given set of data. The invention first determines the average programming state (corresponding to an average threshold voltage level) for the set of data which is to be programmed into the memory cells. This is accomplished by counting the number of programming states which must be traversed in programming the cells with the data. If the majority of the data requires programming the memory cell(s) to the upper two programming states (in the case of a two bit per cell or four state system), then the data is inverted and stored in the memory in the inverted form. This reduces the amount of programming time, the number of programming states traversed, and the power consumed in programming the memory cell(s) with the data field. In the case of data which is encoded using a scheme other than a direct sequential ordering of the threshold voltage levels, the encoded data is converted into an alternate form prior to counting the states. A flag indicating the translation operation (inversion of states, reassignment of states to different levels, etc.) used to assign the existing threshold voltage levels to those that will be programmed into the memory cells is also stored. The flag can be used to indicate the transformation process needed to convert the stored data back to its original form.

26 Claims, 12 Drawing Sheets

6,073,208

APPARATUS AND METHOD FOR REDUCING PROGRAMMING CYCLES FOR MULTISTATE MEMORY SYSTEM

This application is a continuation of U.S. Ser. No. 08/730,099 filed Oct. 15, 1996 U.S. Pat. No. 5,907,855.

TECHNICAL FIELD

The present invention relates to multistate memory devices, and more specifically, to an apparatus and method for reducing the number of programming cycles needed to program a given field of data into the memory cells of a multistate memory system.

BACKGROUND OF THE INVENTION

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon techniques such as manufacturing larger die which contain more memory cells, or using improved photolithography techniques to build smaller memory cells. Reducing the size of a memory cell allows more cells to be placed on a given area of a single die.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to a floating gate. The amount of charge residing on the floating gate determines the voltage required on the control gate in order to cause the device to conduct current between the source and drain regions. This voltage is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

A multi-bit or multistate flash memory cell is produced by creating multiple, distinct threshold voltage levels within the device. Each distinct threshold voltage corresponds to a set of data bits. This allows multiple bits of binary data to be stored within the same memory cell. When reading the state of the memory cell, each cell has a binary decoded value corresponding to a value dependant upon the conduction of the cell at its present threshold voltage level. The threshold voltage level for which the cell compares to a sense amplifier having a preselected input value indicates the bit set representing the data programmed into the cell. Proper data storage requires that the multiple threshold voltage levels of a multistate memory cell be separated from each other by a sufficient amount so that a level of a cell can be programmed or erased in an unambiguous manner. The relationship between the data programmed into the memory cell and the threshold voltage levels of the cell depends upon the data encoding scheme adopted for the cells.

In programming a multistate memory cell, the objective is to apply a programming voltage over a proper time period to store enough charge in the floating gate to move the threshold voltage to a desired level. This level represents a state of the cell corresponding to an encoding of the data which is to be programmed into the cell. However, dividing of the threshold voltage range for a two state (one bit) cell into multiple threshold voltage levels reduces the margin (threshold voltage difference) between levels. This necessitates tighter system design tolerances and reduced programming operation noise margins so that adjacent levels can be differentiated and programming errors reduced. However, the tightening of the programming and read operation threshold voltage windows has led to slower programming procedures and introduced another potential source of memory system errors.

U.S. Pat. No. 5,043,940, entitled "Flash EEPROM Memory Systems Having Multistate Storage Cells", issued Aug. 27, 1991, describes a method of programming a multistate memory cell in which an iterative read-compare-program cycle is executed. During the cycle, the data intended to be programmed into a memory cell is input to a comparator, along with the outputs from a set of sense amplifiers (each having a different reference voltage) connected to the cell. The output of the sense amplifiers indicates the threshold voltage level to which the cell is programmed. If the programmed threshold voltage level corresponds to the encoded representation of the intended data, then the cell is in the correct state.

If the intended data doesn't correspond to the programmed threshold voltage level, then a programming control circuit is activated. A single, short duration programming pulse is then applied to the cell, followed by another read operation using the sense amplifiers. This cycle is repeated until the data comparison operation indicates a correct threshold voltage level, or until the maximum number of programming pulses has been applied.

U.S. Pat. No. 5,394,362, entitled "Electrically Alterable Non-volatile Memory with N-bits per Memory Cell", issued Feb. 28, 1995, describes a similar method of programming a multistate memory cell. An iterative cycle of determining the threshold voltage level of a cell, using the threshold voltage level to determine the data contained in the cell, comparing the data programmed into the cell to data intended to be programmed, and then generating a programming pulse to alter the cell's threshold voltage level is performed. This cycle is repeated using the same period and amplitude for the programming pulse during each cycle, until the sense amplifiers indicate that the cell has been properly programmed.

Although both of the described methods for programming a multistate memory cell are capable of performing the desired function, they do so in an inefficient manner. This is because they implement the programming operation for every data field by causing the threshold voltage level to incrementally increase from a base value (the erased state level) until it reaches a desired value. This process can result in an increase in the number of programming states which must be traversed, programming time, and power consumption compared to a system which is capable of programming the memory cells in a manner which reduces the number of higher programming states used to program a given field of data.

What is desired is an apparatus and method for programming a multistate memory cell which reduces the number of higher programming states used to program a given field of data compared to presently used programming methods.

SUMMARY OF THE INVENTION

The present invention is directed to an apparatus and method for reducing the number of programming states (threshold voltage levels) required to be traversed when programming a multistate memory cell with a given set of data. This is accomplished by reducing the number of data bits in the higher programming states, thereby reducing programming time, memory system power consumption, and programming errors during the programming of a specified data field. In addition, by reducing the number of programming pulses used, the gate and drain disturb of the memory cells is significantly reduced. This provides the memory system with better long term reliability.

The invention first determines the average programming state (corresponding to an average threshold voltage level) for a given field of data which is to be programmed into the memory cells. This is accomplished by counting the number of programming states which must be traversed in programming the cells with the data in the data field. If the majority of the data requires programming the memory cell(s) to the upper two programming states (in the case of a two bit per cell or four state system), then the data is inverted and stored in the memory in the inverted form. This reduces the amount of programming time, the number of programming states traversed, and the power consumed in programming the memory cell(s) with the data field. In the case of data which is encoded using a scheme other than a direct sequential ordering of the threshold voltage levels, the encoded data may need to be converted into an alternate form prior to counting the states.

A flag indicating the translation operation (inversion of states, reassignment of states to different levels, etc.) used to assign the existing threshold voltage levels to those that will be programmed into the memory cells is also stored. The flag can be used to indicate the transformation process needed to convert the stored data back to its original form.

Further objects and advantages of the present invention will become apparent from the following detailed description and accompanying drawings.

DETAILED DESCRIPTION OF THE INVENTION

Figure 1:
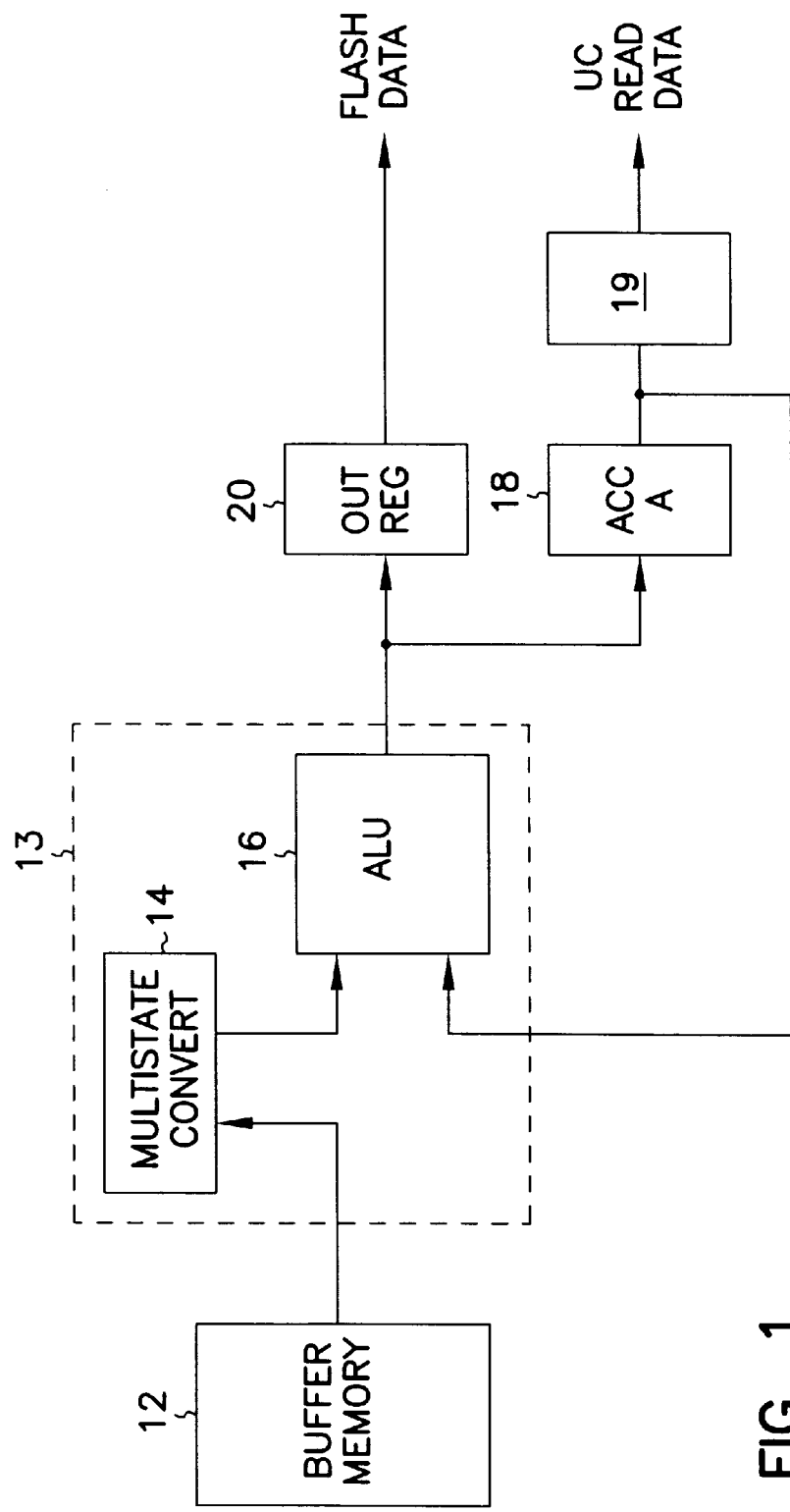
FIG. 1 is a block diagram of the apparatus of the present invention for reducing the number of programming cycles for a multistate memory system.

Referring to the drawings, FIG. 1 is a block diagram of the apparatus of the present invention for reducing the number of programming cycles for a multistate memory system. Buffer memory 12 is used to store data supplied by a controller (not shown). This data is that intended to be programmed into the memory cells of the memory system.

The data in buffer 12 is supplied to programming states analysis module 13 which performs the operations needed to determine the number of programming states required to program the supplied data into the cells of the memory system. Programming states analysis module 13 is composed of two primary sub-modules: multistate data conversion module 14, used to convert the input data into a form in which the number of required programming states is more easily counted; and arithmetic logic unit (ALU) 16, used to sum up the number of programming states required to program a block (or set) of data. Accumulator A register 18 is used to sum the required programming states from the baseline erased state for each byte of data contained in a field or set of data (typically 32 bytes). This produces a value for the total number of programming states required for the data in the data field.

After the number of programming states required to program the data field has been determined, the controller reads the number and determines if the data is predominantly in the lower two programming states (for a two bit per cell storage system) or the upper two programming states. If the majority of the data is in the lower two states, the data obtained from buffer 12 is passed through ALU 16 and supplied to data out register 20, from which it is transferred to the memory cells of the memory system.

If the majority of the data is in the upper two states, the data obtained from buffer 12 is operated on by ALU 16 to convert the data to its inverted form (or another re-encoded form) and then supplied to data out register 20, from which it is transferred to the memory cells. By re-encoding the data, the total number of programming states required to be traversed in programming the data is reduced.

The programming states analysis logic contained in programming states analysis module 13 can be implemented in several ways using various degrees of complexity, depending on user needs and cost constraints. The overall write reduction method of the present invention consists of two parts: (1) a method for determining the total number of programming state values for the data being analyzed; and (2) means for converting the data to alternate forms (when indicated) for reducing the number of programming states which are required to be traversed when programming the data into the memory cells.

Three methods of determining the number of programming states required to program a set of data into a memory cell or cells of a multistate memory device will be described. In the first method, a simple concatenating of adders is used. This method sums the state values of each cell to obtain the total state value for a data field or data set. For a multistate memory cell having four states, the memory system takes a two bit set of input data and stores these two bits in a memory cell by encoding the bits so that they correspond to a particular threshold voltage level or state. The method to be described assumes that the encoding scheme used to correlate the threshold voltage levels with the data is:

| Bit 1 Value | Bit 0 Value | State |
| --- | --- | --- |
| 1 | 1 | Erased State |
| 1 | 0 | First State |
| 0 | 1 | Second State |
| 0 | 0 | Third State |

As is apparent, each programming level is obtained by incrementing the encoded value for the previous level by one. Using such an encoding scheme, a summing of the actual data values provides a summing of the number of programming states required. Note that the reverse of the example state assignments will also work in the same manner to be described.

As noted, the methods of the present invention count the data (state) values and accumulate a total state count for the data being analyzed. The total state count divided by the number of programmed cells gives a value which indicates how the data is weighted with regards to the average programming state per cell. This value can be used by a controller to determine if it is desirable to convert the given data to an alternate representation that will result in a reduction in the number of bits to be programmed to the higher programming states of the memory cells.

Figure 2:
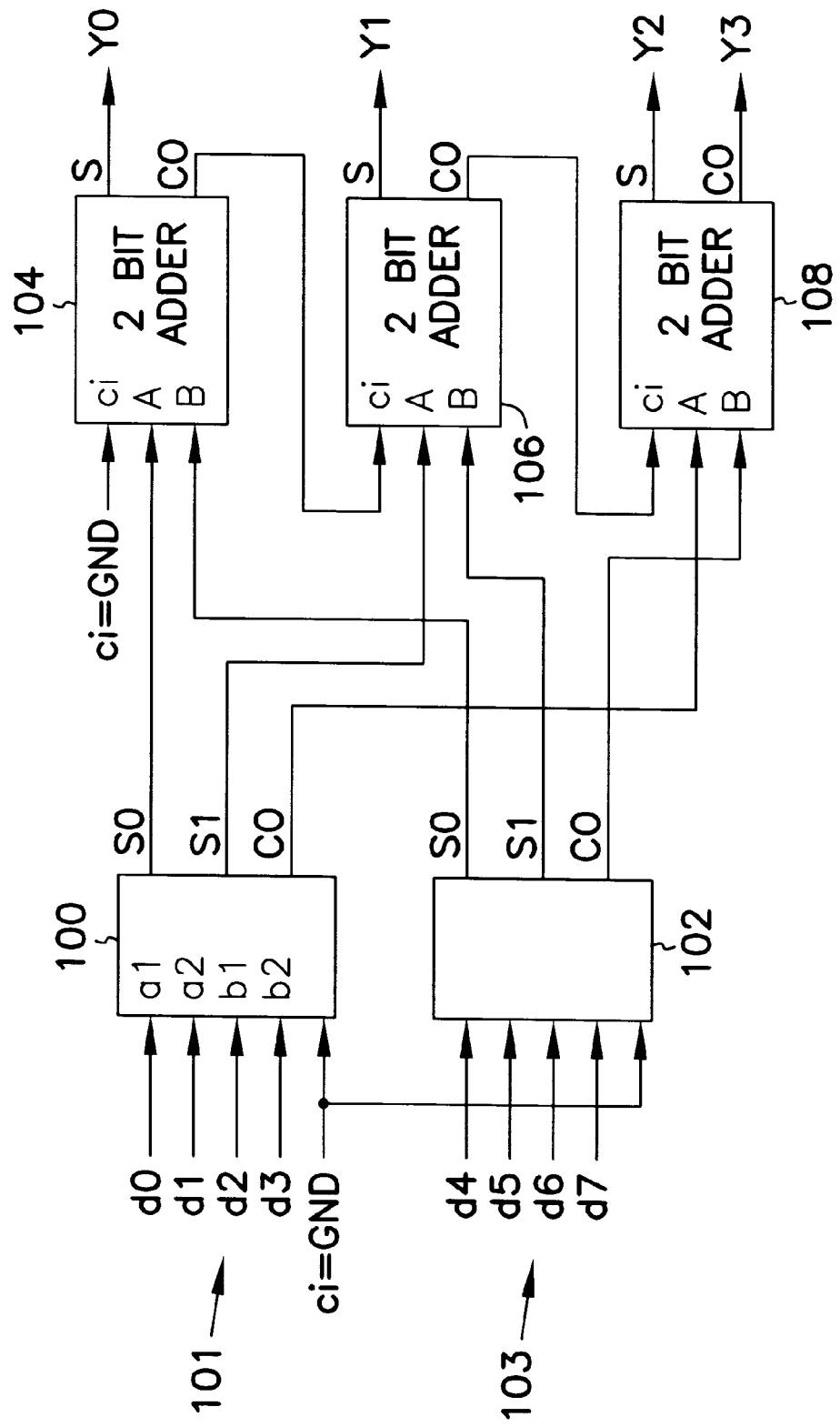
FIG. 2 is a circuit for a first embodiment of the programming states analysis module of FIG. 1.

FIG. 2 is a block diagram of a circuit for a first embodiment of multistate conversion module 14 contained in programming states analysis module 13 of FIG. 1. Note that the operation of ALU 16 of FIG. 1 is well known in the industry and will not be described further at this time. FIG. 2 shows the components required to perform the programming state summation for cells storing 2 bits of data (4 programming states) using the encoding scheme previously described. FIG. 2 shows the circuitry which is implemented by multistate conversion module 14 of FIG. 1. Using the above-described encoding format, no data conversion is required and simple state addition is implemented in this case. Multistate data conversion module 14 acts to pass the data from buffer 12 to ALU 16, producing a state count for the byte of data taken from buffer memory. As shown in FIG. 2, a byte of data (indicated by bits $d_0$ to $d_7$ in the figure) is input in two groups 101 and 103 to 4 bit adders 100 and 102. Data group 101 contains bits $d_0$ to $d_3$ of the byte of data, while data group 103 contains bits $d_4$ to $d_7$ of the byte of data.

Adders 100 and 102 are configured to add bit pairs to produce the sum of the data values contained in the bit pairs. Thus, adder 100 treats input data bits $d_0$ and $d_1$ as a first bit pair $(a_1, a_2)$, and input data bits $d_2$ and $d_3$ as a second bit pair $(b_1, b_2)$. Adder 100 adds bit pair $(a_1, a_2)$ to bit pair $(b_1, b_2)$, producing sum terms $S_0$ and $S_1$, and carry out term $C_0$. Adder 102 similarly acts on input data bits $d_4$ to $d_7$ to produce the sum terms $(S_0$ and $S_1)$ and carry out term $C_0$ representing the sum of the data values contained in the bit pairs consisting of $(d_4, d_5)$ and $(d_6, d_7)$.

The outputs of adders 100 and 102 are connected as shown in the figure to 2 bit adders 104, 106, and 108. Adder 104 performs an addition of the $S_0$ sum terms produced by adders 100 and 102. Adder 106 performs an addition of the $S_1$ sum terms produced by adders 100 and 102. Adder 108 performs an addition of the $C_0$ carry out terms produced by adders 100 and 102. The outputs of adders 104, 106, and 108 are four terms $Y_0, Y_1, Y_2$, and $Y_3$, representing the four bits of a number, Y, which is the total number of programming states required to program the input data. For example, the input value shown below would produce the indicated output:

$$00000000 \Rightarrow 0000 \text{ out}$$

$$00110011 \Rightarrow 0110 \text{ out}$$

$$11111111 \Rightarrow 1100 \text{ out (max count)}$$

As can be seen, each bit pair counts as a value from zero to three. With 4 bit pairs the maximum value determined by this addition arrangement would be 4×3=12 decimal, which would be represented as C0 in hexadecimal or 1100 in binary. With the above approach the total number of states represented by a byte is calculated directly by summing the data values.

The resultant bit summation from the circuitry shown in FIG. 2 is input to one side (port) of ALU 16. The other side (port) of the ALU is input from accumulator A 18 register, which is preset to 00 as an initial value. The summation of the values present at both ports of ALU 16 is achieved through proper selection of the ALU function (i.e., Port A+Port B). The output of ALU 16 is stored in Accumulator A 18. The controller then inputs another byte from buffer memory 12 into multistate convert module 14, again counting the number of states in the byte and applying it to a port of ALU 16. The other ALU port has as an input the sum of bits determined by previous counting cycles. The two ALU ports are again added together, with the resultant value again stored in accumulator A 18. This procedure of counting states in the multistate convert, along with summing the results via ALU 16 and accumulator A 18 is repeated for the number of bytes to be programmed in a single programming operation in the memory. Once the number of bytes to be programmed have been processed in this manner, accumulator A 18 contains a value of the number of states to be traversed. The value of states to be traversed during programming is gated to the controller microcontroller via buffer 19. The microcontroller determines the polarity of the data, based on the accumulated state count and the number of bytes to be programmed. The microcontroller then sends the data from buffer memory 12 just counted through ALU 16, in inverted form or passed through, to output register 20, from which it will pass to the memory cells for programming.

The above state counting method is based on the encoding scheme described above. If this is not the case, as for alternate state assignments or gray coding schemes, then the data would be subjected to a preprocessing operation by multistate data conversion module 14 to convert the data to normal order for counting. For example, if the gray code encoding scheme shown below is used,

| Bit 1 Value | Bit 0 Value | State |
|---|---|---|
| 1 | 1 | Erased State |
| 1 | 0 | First State |
| 0 | 0 | Second State |
| 0 | 1 | Third State | then a conversion of data in the second (0 0) and third (0 1) states would be necessary to allow simple adding of the data to obtain the total state count. To convert the data to normal sequential state values, state value (0 1) would be converted to (0 0), and state (0 0) would be converted to (0 1).

Figure 3:
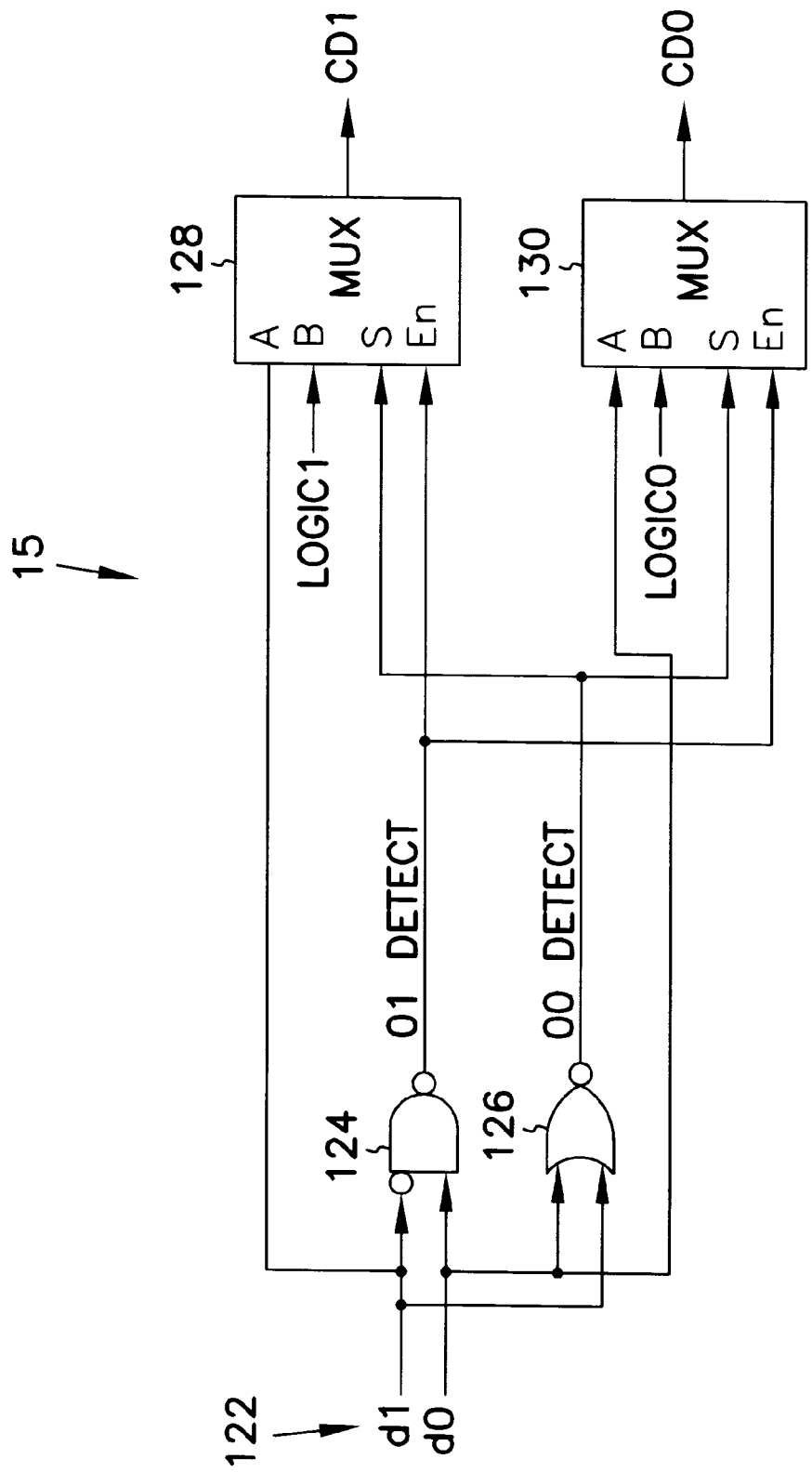
FIG. 3 is a circuit for a data converter module which can be used to pre-process the data prior to it being summed by the programming states analysis module of FIG. 2.

FIG. 3 is a circuit for data converter module 15 which can be used to pre-process the data prior to it being summed by programming states analysis module 14 of FIG. 2. Note that both data converter 15 of FIG. 3 and the counting and summing circuit 14 of FIG. 2 can be considered part of multistate conversion module 14 of FIG. 1, depending upon whether the pre-processing accomplished by the circuit of FIG. 3 is required. The requirements for the data conversion are usually determined during the design of the memory system. However, if desired, one of a number of data conversion schemes can be implemented as necessary by the system in the situation where a controller is designed to be used with memory cells having different encoding schemes.

For each bit pair (in a 4 state cell) the circuit of FIG. 3 adjusts the data values prior to the programming states being counted and summed using a circuit of the type shown in FIG. 2 and an ALU and accumulator. As shown in FIG. 3, each pair of input data bits 122 ($d_0$ and $d_1$ in the figure), is input to NAND gate 124 and to NOR gate 126. Note that one bit of the input data is inverted (bit $d_1$ in this case) prior to input to NAND gate 124. The output of NAND gate 124 is a zero if bit $d_1$ is a zero and bit $d_0$ is a one. This corresponds to the bit pair (0 1). The output of NAND gate 124 is a one for the ($d_1$, $d_0$) input bit pairs (0 0), (1 0), and (1 1). The output of NOR gate 126 is a one if both bits $d_0$ and $d_1$ are zero, and zero otherwise.

The output of NAND gate 124 is provided as an enable signal input to multiplexers 128 and 130. Bit $d_1$ is provided as the A data input to multiplexer 128 and a logic value of one is provided as the B data input. The output of NOR gate 126 is provided as a selection signal to multiplexers 128 and 130. Bit $d_0$ is provided as the A data input to multiplexer 130 and a logic value of zero is provided as the B data input. The output of multiplexer 128 is converted data bit one, labelled $CD_1$, in the figure. The output of multiplexer 130 is converted data bit zero, labelled $CD_0$, in the figure.

In the circuit of FIG. 3, the input data bit pair ($d_1$=0, $d_0$=1) results in the output of NAND gate 124 being low and the output of NOR gate 126 being low. When the output of NAND gate 124 (shown as "0 1 detect" signal in the figure) goes low, multiplexers 128 and 130 receive a low enable signal and the multiplexer outputs go low. This forces the data output ($CD_1$ and $CD_0$) to the (0 0) state. This achieves the desired translation of the data from the (0 1) to (0 0) state. When input bit pair 122 corresponds to ($d_1$=0, $d_0$=0), the output of NAND gate 124 is high and the output of NOR gate 126 (shown as "0 0 detect" signal in the figure) is high. This results in selecting the B inputs as the outputs ($CD_0$, $CD_1$) for the multiplexers. When the B input is selected, a ($CD_1$=0, $CD_0$=1) state is forced on the multiplexer outputs, achieving the desired translation of the data from the (0 0) to (0 1) state. All other state values (i.e., (1 1) and (1 0) in this example) input to FIG. 3 result in the multiplexers being enabled and the A inputs being selected. The data in these states will not be affected and will pass through the conversion circuit unaltered. Note that the circuitry of FIG. 3 would be repeated four times for a byte of data and eight times for a 16 bit word of data.

If more than 4 states of data were capable of being programmed into a memory cell, similar circuits would be required for each bit grouping (an eight state cell would have 3-bit groups and a sixteen state cell would have 4-bit groups). Such a design is a natural extension of this concept, and its implementation would be within the ability of one skilled in the art.

As noted, FIG. 3 shows a circuit 15 used for converting the data from a gray coded scheme to the form used for input to the adder network of FIG. 2. Upon completion of the conversion operation, the converted data is added in bit pairs to obtain the programming state count for the byte of data. The next step is to sum up all of the programming state counts for an entire field of data (i.e., all the data intended to be programmed in a particular programming operation).

Figure 4:
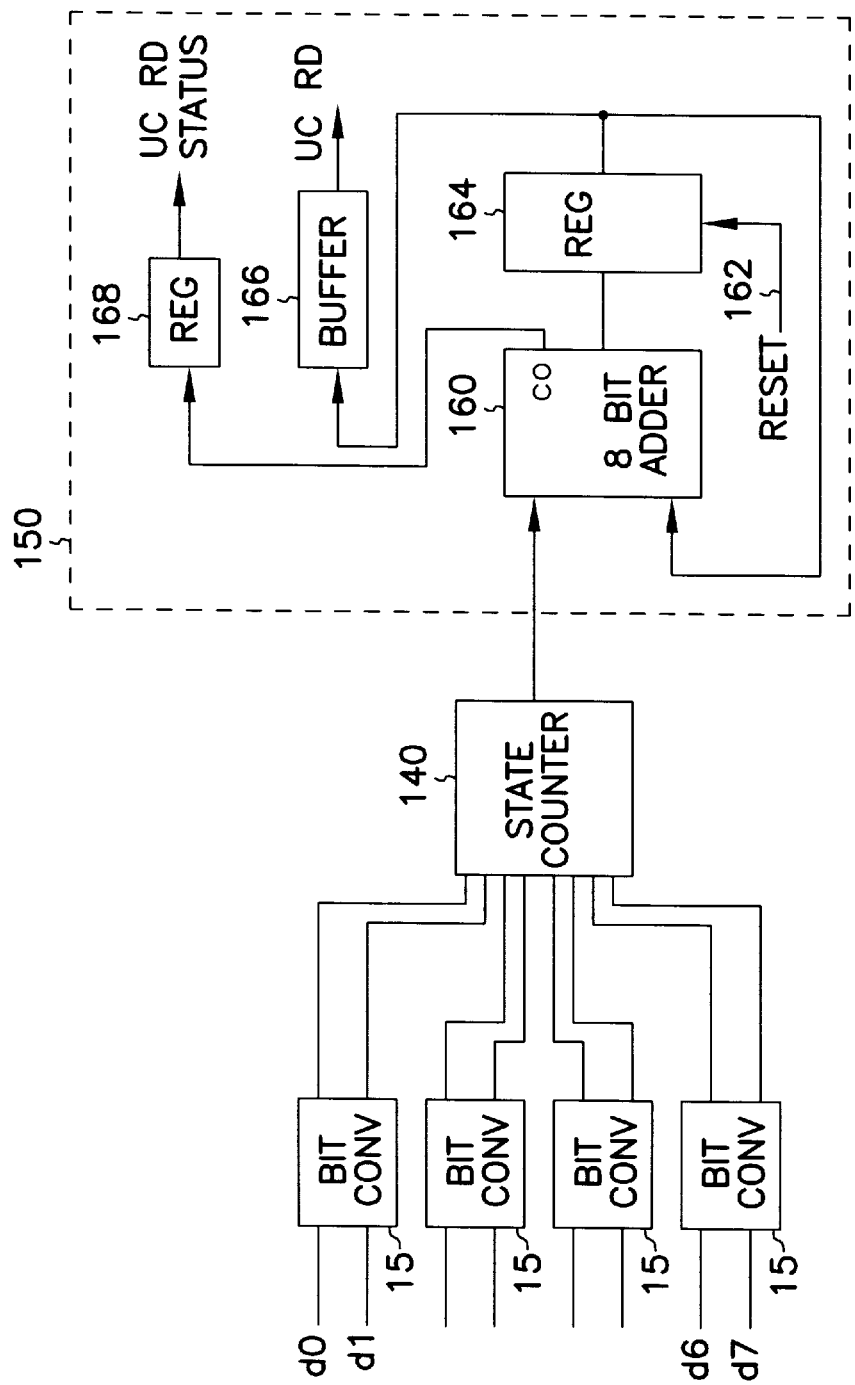
FIG. 4 is a block diagram of a circuit which combines an accumulator function with the circuits of FIGS. 2 and 3 to sum the programming state count for a data field.

FIG. 4 is a block diagram of a circuit which combines an accumulator function 150 with the circuits of FIGS. 2 and 3 to sum the programming state count for a data field. As shown in the figure, input data bits $d_0$ through $d_7$ are input in bit pairs to a set of data converters 15 of the type shown in FIG. 3. The output of data converters 15 are the values of the bit pairs after conversion to the non-gray coded scheme. These values form the inputs for a state counter 140, which may be implemented in the form of circuit 14 of FIG. 2.

When the circuit of FIG. 4 is incorporated in a memory system, a controller would apply a reset signal 162 to accumulator register 164 (which is of the form of register 18 of FIG. 1 in this situation) to zero it out before beginning the computation. The controller would then fetch a byte of data, supplying it to data converters 15 (see FIG. 3) for state adjustments (or pass through of the data if it did not require conversion). The output of the converters would then be supplied to state counter 140 (see adder circuit 14 of FIG. 2), resulting in a count value for the states being programmed for the byte. The state count value would be added to zero in 8 bit adder 160 (which is of the form of ALU 16 in this situation) and placed in accumulator register 164 (which contains an initial value of zero). The register value also serves as an input to 8 bit adder 160 for use in the next addition operation. The next byte of data would be processed in a similar manner, with the output of state counter 140 providing a second input to adder 160. The existing register value is added to the output of adder 160 to obtain the sum of the programming states for the two bytes of data and is stored in accumulator register 164. This cycle is repeated until all of the data field has been processed in byte sized groups. At the end of processing the number of bytes to be programmed, register 164 contains the number of state levels to be programmed for the entire data field. This value is transferred to buffer 166 where it can be read by the controller and used to decide how to most efficiently program the data. The carry out value of 8 bit adder 160 is latched into register 168 to provide an indication when the 256 bit limit of accumulator register 164 has been reached. The latched status data and accumulator register combine to give a controller the information required to select the most efficient method for programming the data.

A second method for performing the counting of the programming states is to use a memory look up table for direct conversion of the states. This can be done by using the data to be programmed as an address for input to a memory, with the data located at that address being a direct conversion of the data to the number of state summations. This approach implements the data functions and state counting functions in one step, with the look up table performing both functions. This approach is best suited for byte or word length processing operations. The resulting value of the data processing performed by the memory will be used with other circuitry to develop a translation scheme for adjusted the data to a form which required fewer programming cycles.

Figure 5:
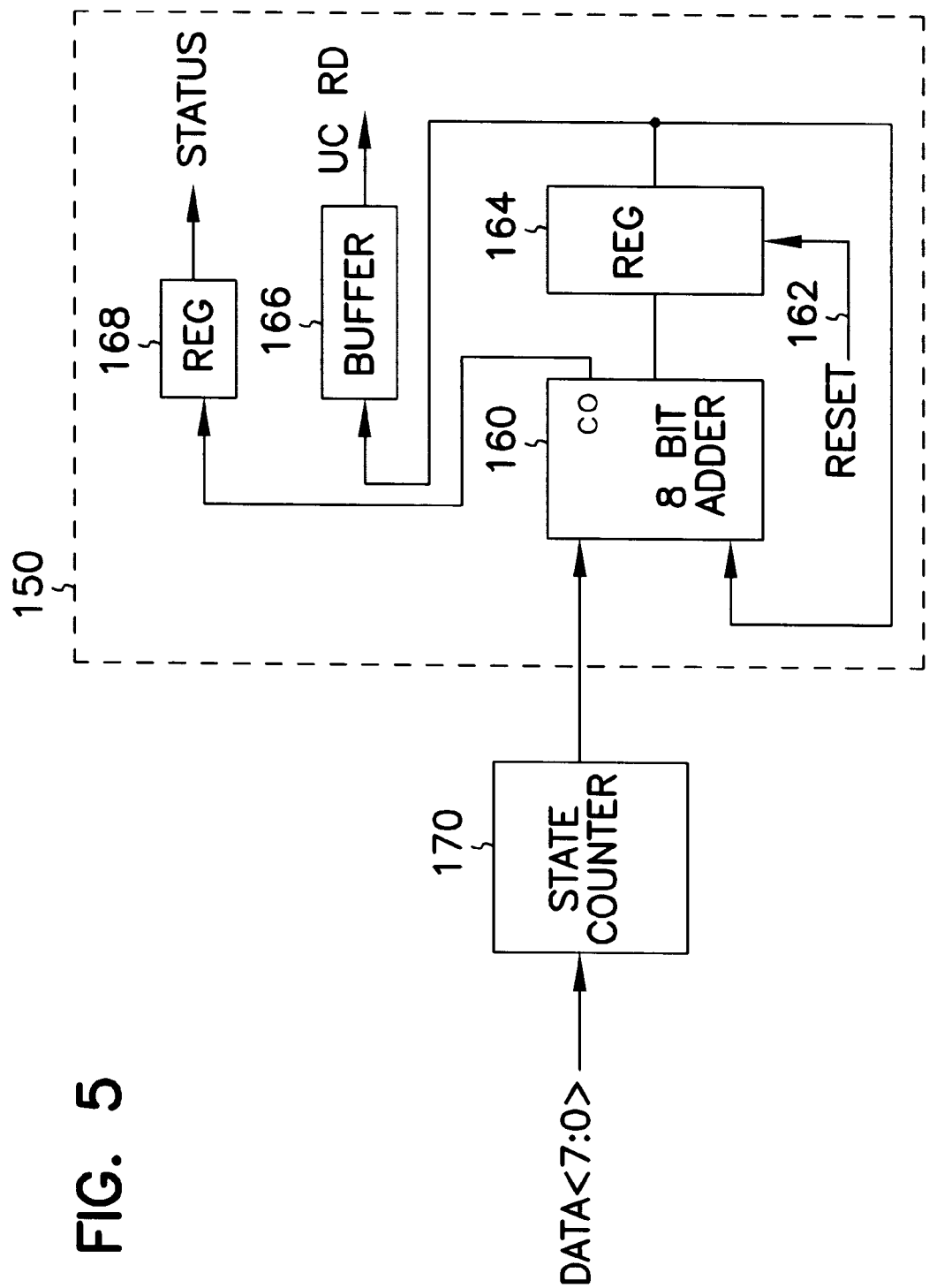
FIG. 5 is a block diagram of a memory look up table based embodiment of the programming states analysis module of FIG. 1.

FIG. 5 is a block diagram of a memory look up table based embodiment of multistate conversion module 14 of FIG. 1. As shown in the figure, a look up table 170 contained in a memory device is used instead of the circuitry shown in FIGS. 2, 3, and 4. The input data is applied directly to look up table 170, with the output being provided to eight bit adder (or ALU) 160 of FIG. 4. As in FIG. 3, accumulator block 150 contains the adding circuitry and summing registers.

A system designer can implement a look up table having values that would be the result of state conversion and state count operations for a given 8 bit data value. For purposes of clarity, examples of a few memory translation values will be described. Note that look up table 170 translates an 8 bit data value to a 4 bit count value. The upper 4 bits would need to be gated inactive if an 8 bit adder is used. An alternative approach would be to use 2 memory elements to input 2 bytes at one time. This would increase the computation speed but may be more costly to implement.

In the following example, it is assumed that the data to be programmed will be encoded in the gray code format discussed previously, i.e, as 11, 10, 00 and 01. A look up table would then translate the encoded data values as described below:
00 will be translated to 01 and counted as 01
01 will be translated to 00 and counted as 00
For a general data word of the form: 00 11 10 01
  00=>01
  11=>11
  10=>10
  01=>00
In this case, the look up table output will be 0110. This represents the sum of the translated values.
For a data word of the form: 11 11 10 10
  11=>11
  10=>10
The look up table output will be 1010, which again is the sum of the translated values.
For a data word of the form: 01 01 01 01
  01=>00
The look up table output will be 0000.

As indicated, the look up table would generate an output for each data value input as an address to the memory element, with the output being the sum of the translated state values. The type of memory used to store the look up table will depend upon many considerations, including the data conversion speed requirements. The memory could be implemented in the form of a ROM (read-only-memory) or EPROM (electrically programmable ROM) device if the data state conversion format was fixed for a particular memory system design. EEPROM (electrically erasable and programmable ROM), Flash memory, or SRAM (static random access memory) devices may be a more attractive method in some situations because the design can be adapted to particulars of the memory cell usage (the number of states in the cell 4, 8, 16 . . . ). A SRAM based approach is attractive if the memory system controller is required to support different types of memory and be both forward and backward compatible. Different coding scheme data would allow for support of conventional two state as well as differing versions of multistate memory.

A third method for performing the counting of the programming states will now be described. In this method, the states are not summed in an accumulator to give a global summed value of the required states, but instead are summed for each individual programming state. This approach uses four summing registers, one for each of the four possible programming state values. This can be expanded to n registers if an n state memory cell is used. In this four state example, each byte is analyzed to determine the state of each bit pair. The number of pairs present for a state are then added and accumulated.

The first step in implementing this method is a circuit that looks at each bit pair, with four bit pairs being examined when processing a byte of data to be programmed into a four state (two bit) memory cell. Each of the four circuits decodes the four possible programming states and activates one of four outputs corresponding to the decoded value of the bit pair. Only one of the output lines would be active at a time, as only one state can exist at a time.

Figure 6:
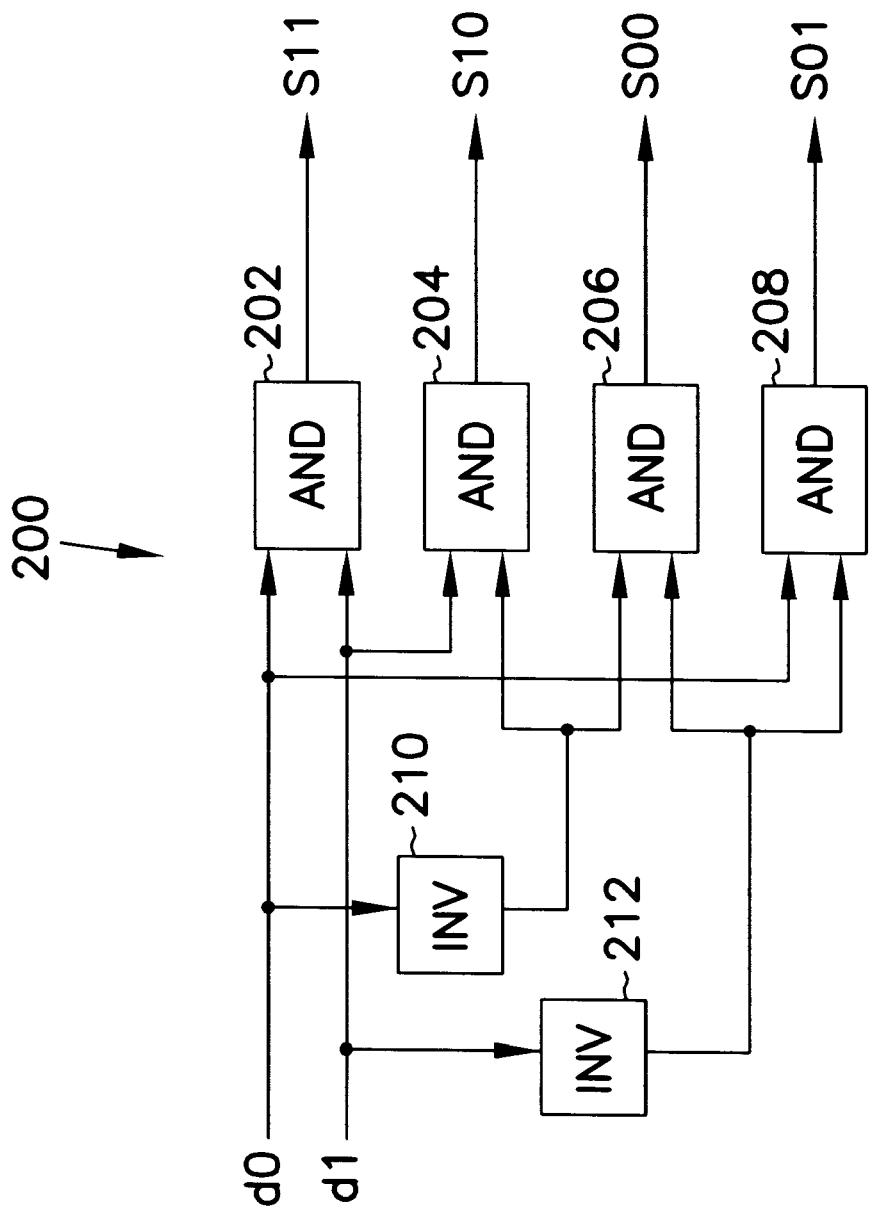
FIG. 6 is a block diagram of a circuit for decoding the programming state corresponding to a pair of data bits for use in a third embodiment of the programming states analysis module of FIG. 1.

FIG. 6 is a block diagram of a circuit 200 for decoding the programming state corresponding to a pair of data bits for use in a third embodiment of a programming states analysis. As shown in the figure, the pair of data bits, $d_0$ and $d_1$, is input to a set of AND gates and inverters. Bit $d_0$ is input directly to AND gate 202, and inverted by inverter 210 prior to being input to AND gates 204 and 206. Bit $d_1$ is input directly to AND gates 202, 204, and 208, and inverted by inverter 212 prior to being input to AND gate 206. The output of AND gate 202 is labeled as $S_{11}$ in the figure, with a high value indicating that the data bit pair corresponds to the programming state (1 1). Similarly, $S_{10}$, the output of AND gate 204 has a high value when the data bit pair corresponds to the programming state (1 0). $S_{00}$, the output of AND gate 206 has a high value when the data bit pair corresponds to the programming state (0 0). Finally, $S_{01}$, the output of AND gate 208 has a high value when the data bit pair corresponds to the programming state (0 1).

One such circuit of the type shown in FIG. 6 is needed for each bit pair, or memory cell in the case of a cell storing two bits of data among four threshold voltage levels. The circuit of FIG. 6 can be altered to decode the programming state(s) for a cell storing a greater number of data bits among a correspondingly larger number of threshold voltage levels.

Given the configuration of FIG. 6, the outputs of a multitude of FIG. 6 circuits (one for each pair of data bits) are input into a circuit which converts the inputs to a binary output representing the number of times the data in the block of data being analyzed requires programming to each of the possible states. This simplifies the remaining processing of the data. As a byte of data is typically operated on at a time (this number is a function of the data bus width implemented in the memory system design), this means that four of the circuits of FIG. 6 are processing the data, producing four sets of possible $S_{11}$, $S_{10}$, $S_{00}$, and $S_{01}$ outputs.

Figure 7:
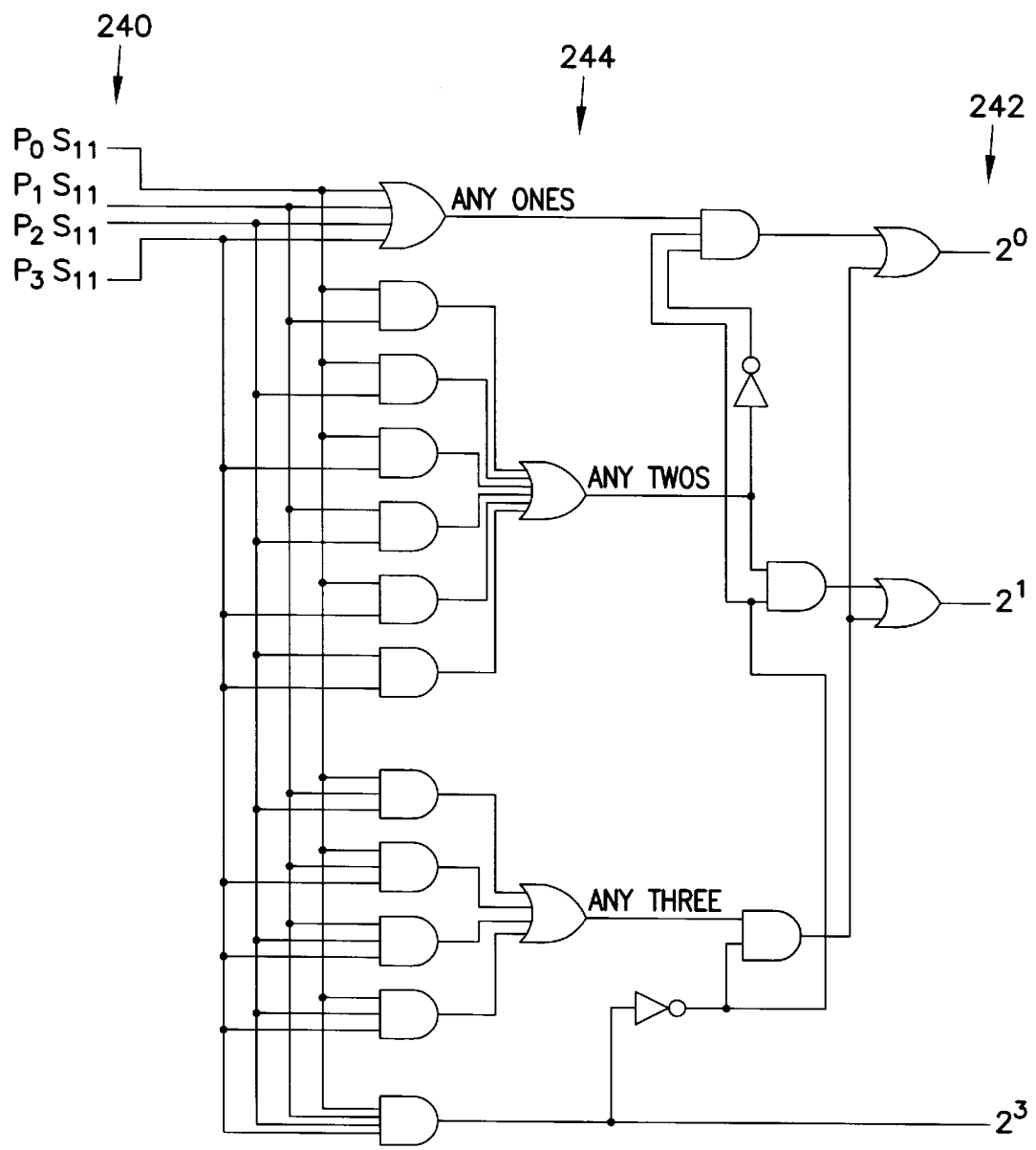
FIG. 7 shows a programming state summation circuit for summing the outputs produced by the decoding circuit of FIG. 6.

The four sets of decoded output signals are input to the circuit of FIG. 7, which shows a programming state summation circuit 244 for summing the outputs produced by the decoding circuit of FIG. 6. One circuit of the type shown in FIG. 7 would be used for each possible programming state, so that for the case of a memory cell having four programming states, four of the summation circuits would be needed.

As shown in FIG. 7, the signals output by the decoder(s) of FIG. 6 are grouped according to programming state, and the signals for each state (for all data bit pairs being analyzed) are input to a circuit of the type shown. Thus, in FIG. 7, decoder signals $S_{11}$ for data bit pairs $P_0$, $P_1$, $P_2$, and $P_3$ serve as inputs 240. Three similar circuits will have the $S_{10}$, $S_{00}$, and $S_{01}$ signals as inputs.

Input signals 240 are processed through the logic gates shown in FIG. 7 to produce an output signal 242 corresponding to a binary value representing the number of times that programming state ($S_{11}$ for the example shown) is encountered in the byte of data being analyzed. As noted, conversion of the decoded state signals into a count value allows for ease in summing the number of states that exist.

Figure 8:
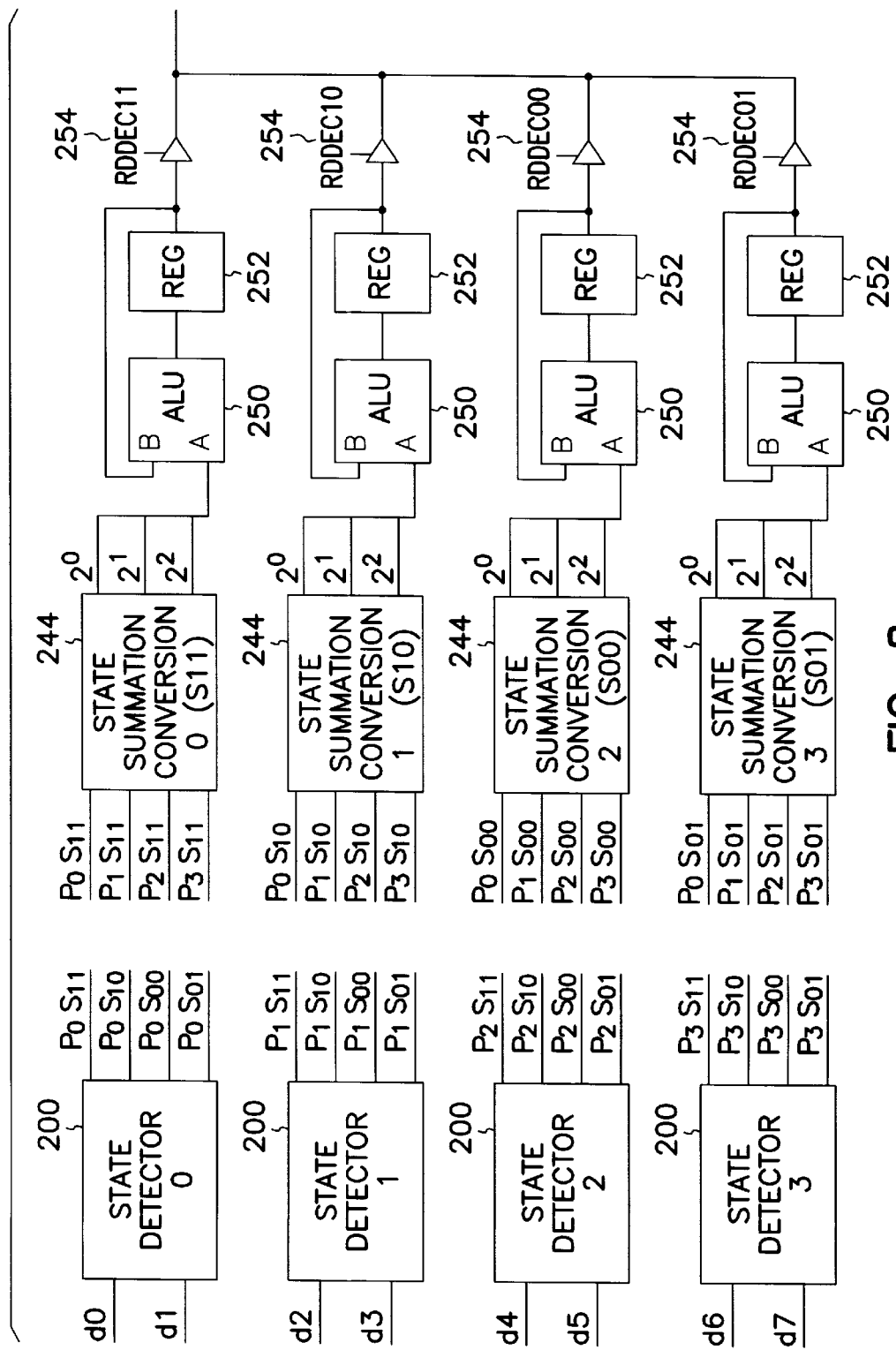
FIG. 8 is a block diagram showing how the state decoders of FIG. 6 and the state summation circuits of FIG. 7 can be combined with ALU and register logic to arrive at a programming state count for each set of data to be programmed.

FIG. 8 is a block diagram showing how state decoders 200 of FIG. 6 and state summation circuits 244 of FIG. 7 can be combined with ALU and register logic to arrive at a programming state count for each set of data to be programmed. The circuit design represented by the block diagram of FIG. 8 performs programming state counting on a byte of data as the basic unit. A greater or lesser number of pairs of data bits could be operated on by altering the number of state decoders and altering the state summation circuits to accommodate the proper number of inputs and outputs.

As shown in FIG. 8, each state decoder 200 produces an output representing the programming state of a specific pair of data bits (labelled $P_iS_{jk}$ in the figure for data bit pair $P_i$ and state $S_{jk}$). These outputs are grouped according to state value ($S_{jk}$) and input to state summation circuits 244. The outputs of summation circuits 244 serve as inputs to ALU 250.

Each state summation circuit 244 converts the count for one of the four possible states to a binary value. For example, the top block in the figure takes the four inputs for state (1 1) and converts it to a binary value. The output from this circuit is supplied to ALU 250, which is combined with summing register 252. Summing register(s) 252 are initially set to zero by a clear counters reset signal. The output of ALU(s) 250 are stored in summing register(s) 252. After processing of a byte of data by the circuits shown in FIG. 8, the next byte of data is input. After all the bytes of data contained in the data field being analyzed have been processed, the number of times each programming state is programmed is contained in summation registers 252.

The memory system controller will then read the summation values held in the registers by means of read lines 254. After reading the registers, the controller will order the counts in ascending or descending order. The controller will then determine a translation value for each programming state which corresponds to a data value for programming the data. The translation value will be used to convert the data to an alternate encoding scheme. The object of using the translation values is to assign the programming state with the highest number of counted occurrences to the lowest programming threshold voltage level, thereby reducing the number of programming cycles required for the data field.

In the state assignments corresponding to the gray coded scheme discussed previously, the lowest programming state is the erase state, which is assigned a value of (1 1). In this case, the assignment of counted programming states to programming levels for highest state count to lowest state count would be done as follows:

State 11 => Highest Decode Count
State 10 => 2nd Highest Decode Count

-continued

State 00 => 3rd Highest Decode Count
State 01 => 4th Highest Decode Count

As an example of how this method would work, assume that 64 bytes will be the length of the data field being programmed. This translates to 512 bits, which require 256 cells to store the data. If all the programmed states for the data were the same then a hexadecimal value of (ff) would be the sum for that programming state summation, with the remaining states having a value of zero. Now assume a data pattern resulted in the following values in the summation registers:

Reg11 = 0f hex = 15 dec
Reg10 = 1d hex = 29 dec
Reg00 = 7c hex = 124 dec
Reg01 = 57 hex = 87 dec The system controller would read these values and reorder the encoding scheme to meet the highest count to lowest count criteria. The codes would be reassigned to reflect the following translation based on the above values:

State 11 assigned to 00
State 10 assigned to 01
State 00 assigned to 10
State 01 assigned to 11

Figure 9:
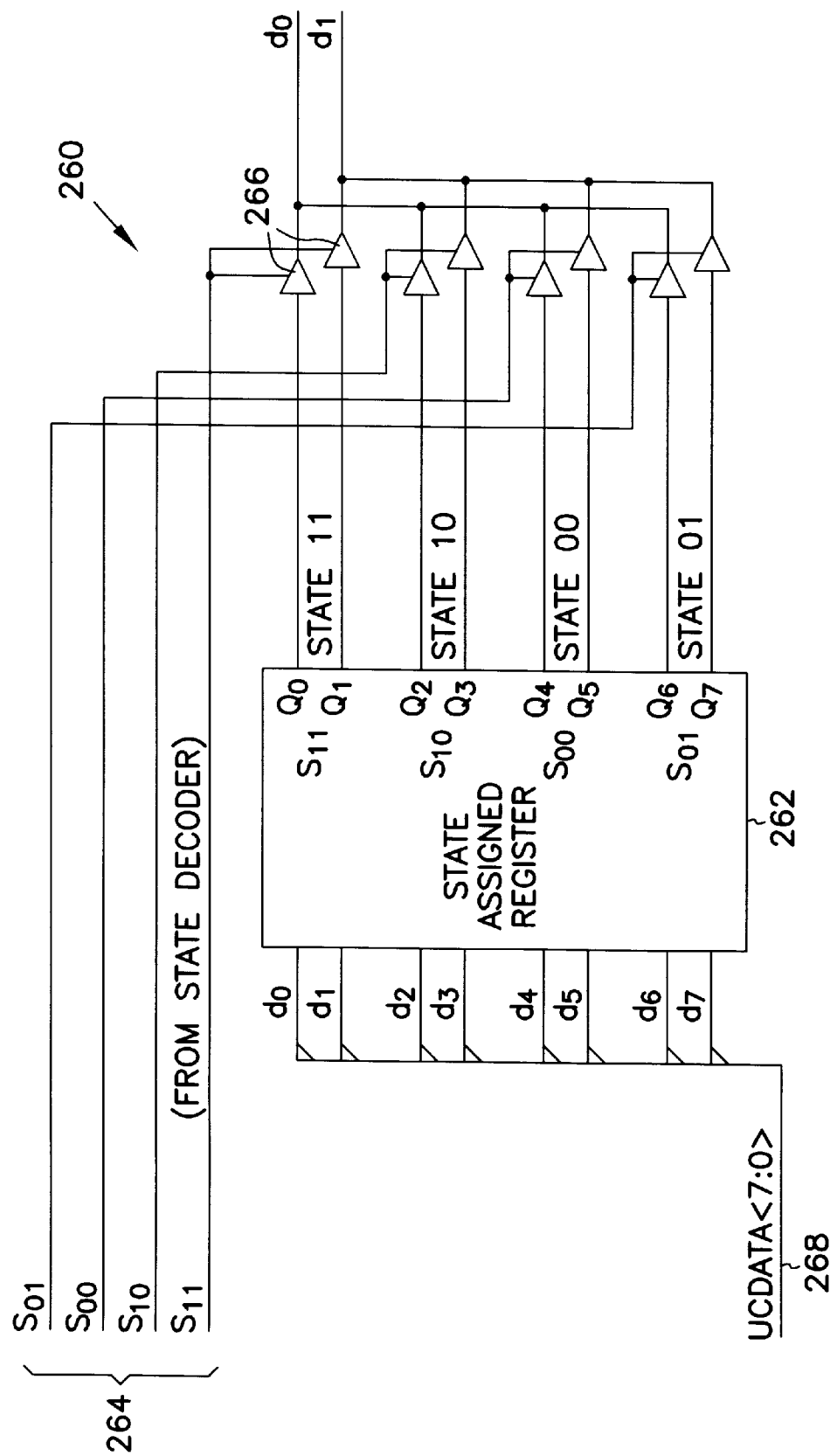
FIG. 9 shows a circuit for a state encoder used to re-encode the data bits in a manner designed to reduce the number of programming cycles required to program the bits into a memory cell.

The controller would accomplish this state conversion by passing the data through a selectable encoding logic, referred to as a state encoder. FIG. 9 shows a circuit for a state encoder 260 used to re-encode the data bits in a manner designed to reduce the number of programming cycles required to program the bits into a memory cell.

FIG. 9 shows an eight bit state assignment register 262 which is programmed to store the new (translated) state encoding value desired for each input state. The data being sent to the memory system for programming in a multistate cell will be sent to the state decoder of FIG. 6. The output of that circuit will activate one of the four possible programming state signals. The signal that goes active (element 264 in FIG. 9) will enable a buffer pair 266 which will gate the desired value loaded into state assignment register 262 onto the data bus. This sequence will accomplish the translation from one encoded state to another.

For the state translation example given above, it is desired that state (0 0) be translated to state (1 1) prior to being programmed into the memory cell. To do this it is necessary to set $d_4$ and $d_5$ to a value of (1 1) in state assignment register 262 by means of data lines 268. The same procedure is carried out for each state of the memory. State decoder 200 of FIG. 6 will activate one state line at a time, thus only one state translation will occur for each bit pair. The values in state translation register 262 will also go to other sets of circuits of the type shown in FIG. 9, allowing conversion of all bit pairs at one time. For the example counts described above, register 262 would be loaded with a value of (10 11 00 01).

Figure 10:
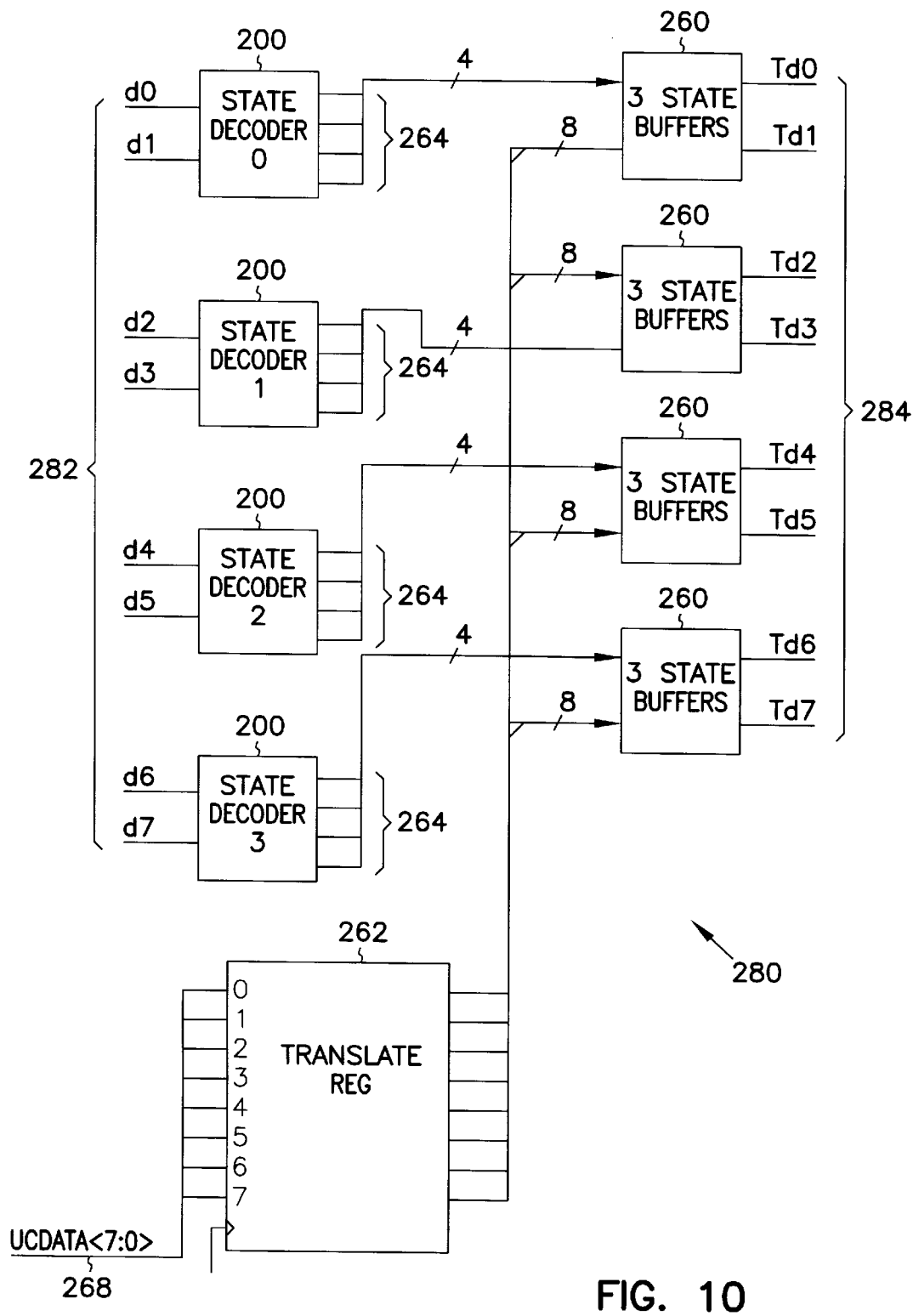
FIG. 10 is a block diagram showing the design for an 8 bit state encoder for translating the programming states for a data byte, based on the state encoder of FIG. 9.

FIG. 10 is a block diagram showing the design for an eight bit state encoder 280 for translating the programming states for a data byte, based on the state encoder 260 of FIG. 9. As shown in the figure, four data bit pairs 282 are input to state decoder modules 200 (see FIG. 6). The output signals 264 generated by the decoders are routed to buffers 260. The signals input to buffers 260 act to select which of the values contained in register 262 are output on data lines 284. The value loaded into register 262 is the translation value for the pair selected. The original data selects which value is detected, while the translated value is contained in register 262 and is enabled depending on the original pair selector. The architecture of FIG. 10 can be altered to support different size data buses or to support a different number of programming states.

Once the data is translated, it is sent to the memory cells for programming. The encoding (data translation) method needs to be stored for use on later reading of the programmed data. One method of doing this is to collect the translation instructions and store them as groups of data at the end of the data write operation in a data packet used for data management. Additional data, such as error correcting codes (ECC), bad bit addresses, and replacement bits can also be stored in the data management section. The stored data which represents the encoding scheme translation method can be either what was used for the write operation or the inverse, which is what would be used during read operations in order to retrieve the desired data. The later approach (storing the inverse) may be desirable, in most cases, because it leads to performance gains in the system when performing read operations. This is because, while the memory system is programming the cells with the translated data, the controller can determine the reverse translation for the value stored. This permits a pre-reverse translation processing whose results can be stored after data is stored. The reverse translation values can then be used directly for faster read operations.

After the translated data is programmed and the reverse translation decoding values are stored, the data may be read back from the cells. When the memory system requests the data, the encoding values are read first, allowing the decoding sequence to progress as the data is read in. The reverse translation value is loaded into state translation register 262 of FIGS. 9 and 10. The incoming data from the memory cells is routed to state decoders 200, which enable one of four possible decode output lines per bit pair. The decode output line in turn enables the translation register value onto the bus, performing the conversion of the stored value in the memory cell to the original data intended to be programmed into the memory cells.

Figure 11:
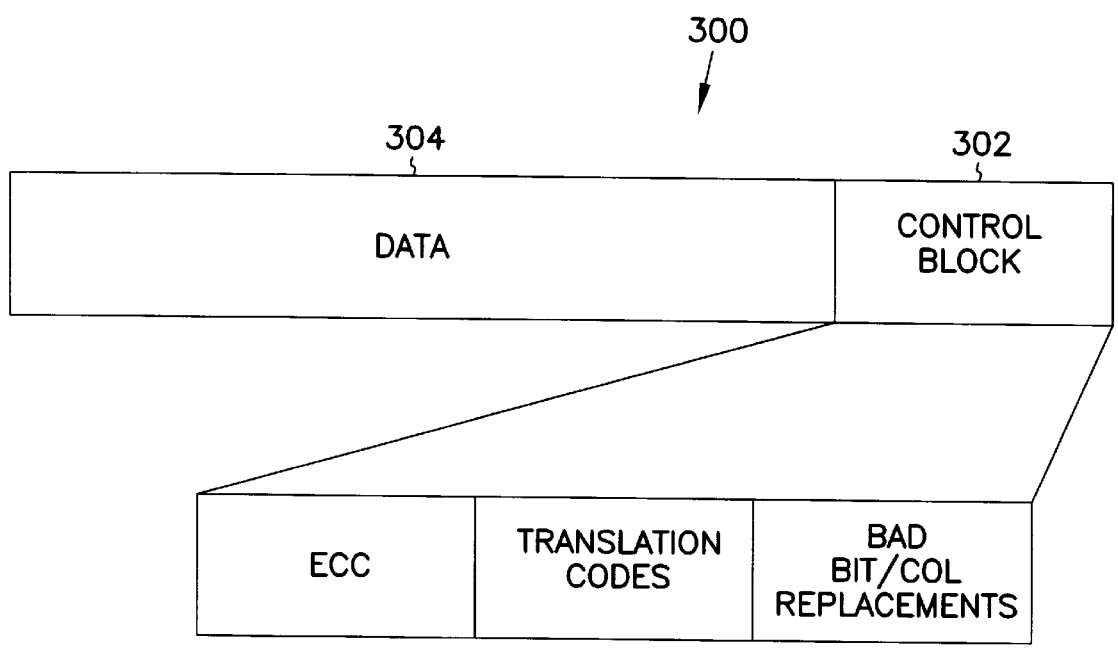
FIG. 11 shows a possible format for storing the data translation values along with the data values for ease in converting the stored data back to its original form.

FIG. 11 shows a possible format 300 for storing the translation values along with the data values for ease in converting the stored data back to its original form. The ECC and translation data can be intermixed with the programmed data for each data field or packet. The extra storage provided by control block 302 is added to the data area allowing this information to be stored along with the data 304 associated with it.

With the format of FIG. 11, the translation codes are read first and are used by the controller to load the state decoders during read operations. As each group of data that was programmed using a unique encoding pattern is encountered, the controller will load the encoder/decoder circuitry (the data translation registers) with the reverse code stored for that data group. The reserve code stored and loaded into register 262 for reads would be 01 00 10 11 in the case of the present example.

It should be noted that the circuitry shown in FIGS. 9 and 10 can be used for both write operation encoding and for read operation decoding. The difference between the two cases is the value stored in the state translation register, which determines the translation of the data presented. An example of the state counting and data translation operations for this situation will now be given.

Assume that a group of write data (packet) has been applied to the circuitry shown in FIG. 8. Further assume that the state counts for each state result in the following results.

State 11 Lowest # of states
State 10 3rd highest # of states
State 00 Highest # of states
State 01 2nd highest # of states With these counts the controller would assign the highest count state to the lowest program state, the next highest count to the next lowest count, etc., until all states had their translation state assigned. For the above counts obtained for each state, the following state assignments would be made.

00 State (Highest Ct.) Assigned to State 11 (Lowest state)
01 State (2nd highest Ct.) Assigned to State 10 (2nd lowest state)
10 State (3rd highest Ct.) Assigned to State 00 (3rd lowest state)
11 State (Lowest Ct.) Assigned to State 01 (Highest Prog. state)

Once the above assignments are made, the write translation vector loaded into register 262 can be assembled. This corresponds to putting the state values in register 262 in the order represented by the decode gating. For this example, assume the circuitry was connected in such a manner that the lowest program state was assigned the lower 2 bits, the second program state assigned the next 2 bits, the third program state assigned the next 2 bits, and the highest program state represented by the top 2 bits. The register assignment is shown below.

| Translation Register Assignment | | | |
| --- | --- | --- | --- |
| State 01 | State 00 | State 10 | State 11 |
| D7 D6 | D5 D4 | D3 D2 | D1 D0 |

With this state assignment of bit pairs, the translation vector assembled for this example would be:

| State 01 | State 00 | State 10 | State 11 |
| --- | --- | --- | --- |
| D7 D6 | D5 D4 | D3 D2 | D1 D0 |
| 1  0 | 1  1 | 0  0 | 0  1 |

Once this translation vector is loaded into register 262, the controller is ready to gate the data out of the buffer, passing it through the translation block and into the memory where it will be stored.

The following shows the translation based on the above transformation vector for 2 bytes of data.

| Original Data | 01, 11, 00, 01, 00, 10, 01, 11 |
| --- | --- |
| Transformation Data Stored in Memory | 10, 01, 11, 10, 11, 00, 10, 01 |

After this data is stored in the memory through a programming sequence, the translation vector must be stored so the controller will have a means for knowing how the data was programmed into the memory cells, allowing it to reverse the process and recover the original data. If the write translation vector was stored, the value 11 10 00 01 would be stored. To speed the operation for reads and use the programming time to calculate the reverse transformations, it is better in this case to store the reverse transformation value. The reverse transformation value is obtained as follows.

The reverse transformation involves substituting the state value that was substituted on the write operation for each state value at the appropriate location. Using the transformation values given earlier, the reverse transformation would be as shown.

| | |
|---|---|
| For State 11 | State 00 was substituted |
| For State 10 | State 01 was substituted |
| For State 00 | State 10 was substituted |
| For State 01 | State 11 was substituted |

These known substitutions would then result in a reverse transformation vector to match the hardware as listed below:

| State 01 | State 00 | State 10 | State 11 |
|---|---|---|---|
| D7 D6 | D5 D4 | D3 D2 | D1 D0 |
| 1  1  | 1  0  | 0  1  | 0  0  |

The reverse transformation value 1 1 1 0 0 1 0 0 could be stored with the data being transformed, such that when that data was to be read the reverse transformation value could be read directly from the memory cells. This data could be loaded into transformation register 262 and the data from the memory could be read in, being transformed back to the original data through the use of circuitry shown in FIG. 12 and the reverse translation value loaded into register 262.

To complete the cycle, the data read back from flash and transformed with the reverse translation vector will be examined.

| | |
|---|---|
| Flash Data | 10, 01, 11, 10, 11, 00, 10, 01 |
| Converted Data | 01, 11, 00, 01, 00, 10, 01, 11 |
| Original | 01, 11, 00, 01, 00, 10, 01, 11 |

From the above data, it is apparent that the original data was transformed to a lower state value and was recovered back to the original by applying the reverse transformation value to the stored data.

Note that the reverse transformation value can be recovered from the transformation value stored. This is possible because the ordering is always consistent, highest to lowest states. For example, the transformation value of 10 11 00 01 can be translated by the following:

01 is in the 11 location, go to the 01 location and store 11
00 is in the 10 location, go to 00 and store 10
11 is in the 00 location, go to 11 and store 00
10 is in the 01 location, go to 10 and store 01

If these steps are followed a register value of

| Loc 01 | Loc 00 | Loc 10 | Loc 11 |
|---|---|---|---|
| 11 | 10 | 01 | 00 | is obtained. This matches the reverse transformation. Thus, it has been shown that the reverse is obtained from the original by the ordering procedure.

The translation codes can be stored directly as they are used or in an assigned table value that shortens the number of bits required to store the data. For a four state memory cell, with four bit pair combinations, there are 24 (4!) possible encoding/decoding possibilities. This determines the number of bits required to store the combinations. A table representing the translation values would save 3 bits per storage group for a four state memory. For a memory system that stores data in packets, with 16 data packets per row, the savings would be 3×16=48 bits saved. An un-encoded, direct store format would require 16 bytes to store the translation values. If encoded, the system would require 10 bytes to store the translation bytes in a compressed table form.

Figure 12:
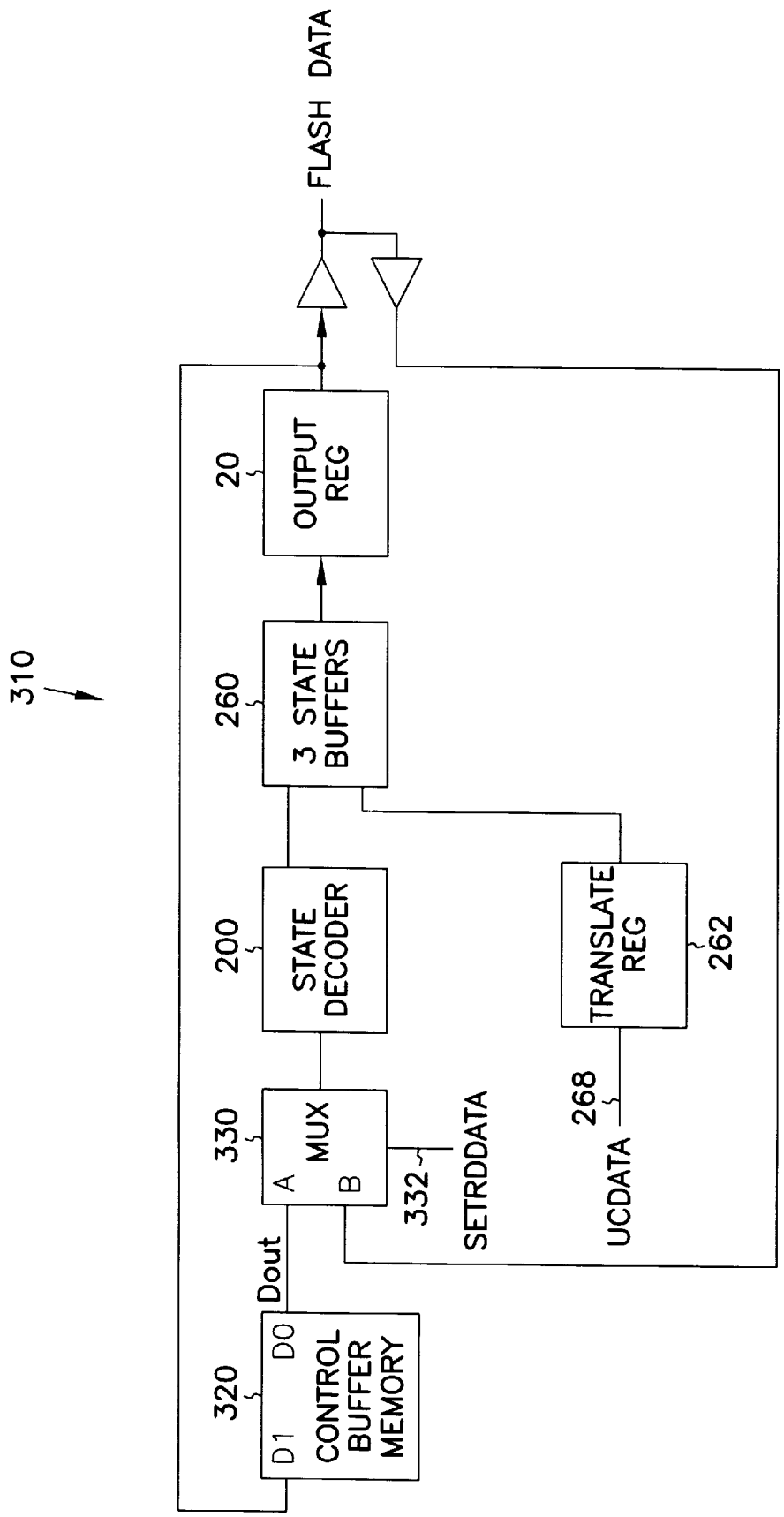
FIG. 12 shows a system block diagram for performing a read/write data transformation using the same circuitry for encoding and decoding the data.

FIG. 12 shows a system block diagram 310 for performing a read/write data transformation using the same circuitry for encoding and decoding the data. As can be seen from the figure, the translation circuitry is used for both read and write operations. This allows a reduction in the required hardware reduction and simplification of the controller design. Note that the circuit of FIG. 12 is only one example of a circuit for performing the method of the present invention and that other designs compatible with the principles discussed herein are possible. For example, other means of converting the and summing the number of programming states can be implemented.

As shown in the figure, controller 320 is responsible for coordinating the data flow between the memory cells and the data translation circuitry. In a typical scenario, intended programming data contained in a data buffer (shown as part of controller block 320 in the figure) is sent through multiplexer 330. Multiplexer 330 is controlled by a control signal input by means of data line 332. When used for the purpose of programming data into the memory cells, data from the data buffer is input in bit pairs to state decoder block 200 which determines the programming state corresponding to the data. The states are then translated to a more efficient encoding of the data by means of buffer block 260 and translation register block 262. The result of the translation is then provided to output register 20 which permits transfer of the data to the memory cells (not shown).

When used for the purpose of reading data from the memory cells and reconverting it back to the original data format, data is read from the cells and input to multiplexer 330. Now control signal 332 is used to select the read data and pass it through to state decoder block 200. Buffer block 260 and data translation register 262 are used to convert the read data back to its original values based on the inverse of the re-encoding scheme used to program the data. Translation register control line 268 is used to load register 262 with the data necessary for encoding or decoding the data.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A memory system, comprising:

an array of multistate memory cells, wherein each memory cell has at least three possible programming states;

a programming states analysis module, wherein the programming states analysis module determines a number of programming states required to be traversed in programming the multistate memory cells with a set of data using a first encoding scheme; and a reprogramming module, wherein the reprogramming module is adapted to apply a second encoding scheme to the set of data when a number of programming states required to be traversed in programming the multistate memory cells with the set of data using the second encoding scheme is less than the number of programming states required to be traversed in programming the multistate memory cells with the set of data using the first encoding scheme.

2. The memory system of claim 1, further comprising:

a data translator adapted to translate the set of data to a format that allows direct summing of the data to determine the number of programming states to be traversed.

3. The memory system of claim 1, further comprising:

a data translator adapted to translate the set of data to a set of programming states determined by the second encoding scheme.

4. The memory system of claim 3, wherein the data translator module includes a memory look up table.

5. The memory system of claim 1, further comprising:

a first data translator adapted to translate the set of data to a format that allows direct summing of the data to determine the number of programming states to be traversed; and a second data translator adapted to translate the set of data to a set of programming states determined by the second encoding scheme.

6. The memory system of claim 1, wherein the programming states analysis module further comprises:

a processing module for determining the average programming state per memory cell for the set of data.

7. The memory system of claim 1, wherein the programming states analysis module includes a memory look up table.

8. The memory system of claim 1, further comprising:

a data read module, wherein the data read module includes a read operation translator, further wherein the read operation translator decodes data programmed into the array of multistate memory cells using an encoding scheme, wherein the encoding scheme is selected from the group consisting of the first encoding scheme and the second encoding scheme.

9. The memory system of claim 1, wherein the programming states analysis module comprises:

a data decoder, wherein the data decoder determines the programming state corresponding to a datum by decoding the datum; and a summing module, wherein the summing module determines the number of times each one of the plurality of possible programming states is programmed for the set of data.

10. A method of storing data, comprising:

determining a first number of programming states to be traversed in programming an array of multistate memory cells with a set of data using a first encoding scheme, wherein the first encoding scheme assigns data values to a first set of programming states;

determining whether a second number of programming states to be traversed in programming the array of multistate memory cells with the set of data using a second encoding scheme is less than the first number of programming states to be traversed, wherein the second encoding scheme assigns data values to a second set of programming states;

translating the set of data to the second set of programming states when the second number is less than the first number; and storing the set of data in the array of multistate memory cells in accordance with a set of programming states, wherein the set of programming states is selected from the group consisting of the first set when the first number is less than the second number and the second set when the second number is less than the first number.

11. The method of claim 10, wherein determining a first number of programming states to be traversed comprises adding the data values for the data contained in the set of data.

12. The method of claim 10, wherein determining a first number of programming states to be traversed comprises converting the data contained in the set of data to a format that allows a direct summing of the data.

13. A method of storing data, comprising:

assigning a set of data to a first set of programming states using a first encoding scheme, wherein the first set of programming states comprises a set of lower programming states and a set of upper programming states;

determining whether a number of data assigned to the set of upper programming states exceeds a number of data assigned to the set of lower programming states;

assigning the set of data to a second set of programming states using a second encoding scheme when the number of data assigned to the set of upper programming states exceeds the number of data assigned to the set of lower programming states using the first encoding scheme;

storing the data in accordance with the first set of programming states when the number of data assigned to the set of lower programming states exceeds the number of data assigned to the set of upper programming states using the first encoding scheme; and storing the data in accordance with the second set of programming states when the number of data assigned to the set of upper programming states exceeds the number of data assigned to the set of lower programming states using the first encoding scheme.

14. The method of claim 13, further comprising:

determining whether a number of data assigned to the set of upper programming states equals a number of data assigned to the set of lower programming states; and storing the data in accordance with the first set of programming states when the number of data assigned to the set of lower programming states equals the number of data assigned to the set of upper programming states using the first encoding scheme.

15. The method of claim 13, wherein the second set of programming states is the inverse of the first set of programming states.

16. A method of storing data, comprising:

assigning a set of data to a first set of programming states using a first encoding scheme, wherein the first set of programming states comprises a set of lower programming states and a set of upper programming states;

determining an average programming state using the first encoding scheme;

assigning the set of data to a second set of programming states using a second encoding scheme when the average programming state is within the set of upper programming states using the first encoding scheme;

storing the data in accordance with the first set of programming states when the average programming state is within the set of lower programming states using the first encoding scheme; and storing the data in accordance with the second set of programming states when the average programming state is within the set of upper programming states using the first encoding scheme.

17. The method of claim 16, wherein the second set of programming states is the inverse of the first set of programming states.

18. A system, comprising:

a controller;

an array of multistate memory cells coupled to the controller, wherein each memory cell has at least three possible programming states;

a programming states analysis module, wherein the programming states analysis module determines a number of programming states required to be traversed in programming the multistate memory cells with a set of data from the controller using a first encoding scheme; and a reprogramming module, wherein the reprogramming module is adapted to apply a second encoding scheme to the set of data;

wherein the controller directs the reprogramming module to apply the second encoding scheme when the controller determines that a number of programming states required to be traversed in programming the multistate memory cells with the set of data using the second encoding scheme is less than the number of programming states required to be traversed in programming the multistate memory cells with the set of data using the first encoding scheme.

19. The system of claim 18, further comprising:

a data translator adapted to translate the set of data to a format that allows direct summing of the data to determine the number of programming states to be traversed.

20. The system of claim 18, further comprising:

a data translator adapted to translate the set of data to a set of programming states determined by the second encoding scheme.

21. The system of claim 20, wherein the data translator module includes a memory look up table.

22. The system of claim 18, further comprising:

a first data translator adapted to translate the set of data to a format that allows direct summing of the data to determine the number of programming states to be traversed; and a second data translator adapted to translate the set of data to a set of programming states determined by the second encoding scheme.

23. The system of claim 18, wherein the programming states analysis module further comprises:

a processing module for determining the average programming state per memory cell for the set of data.

24. The system of claim 18, wherein the programming states analysis module includes a memory look up table.

25. The system of claim 18, further comprising:

a data read module, wherein the data read module includes a read operation translator, further wherein the read operation translator decodes data programmed into the array of multistate memory cells using an encoding scheme, wherein the encoding scheme is selected from the group consisting of the first encoding scheme and the second encoding scheme.

26. The system of claim 18, wherein the programming states analysis module comprises:

a data decoder, wherein the data decoder determines the programming state corresponding to a datum by decoding the datum; and a summing module, wherein the summing module determines the number of times each one of the plurality of possible programming states is programmed for the set of data.

* * * * *